US010965154B2

(12) United States Patent
Shukla

(10) Patent No.: US 10,965,154 B2
(45) Date of Patent: Mar. 30, 2021

(54) DETECTING ACTUATIONS OF BUTTONS OF A CONTROL DEVICE

(71) Applicant: Lutron Technology Company LLC, Coopersburg, PA (US)

(72) Inventor: Jaykrishna A. Shukla, Mays Landing, NJ (US)

(73) Assignee: Lutron Technology Company LLC, Coopersburg, PA (US)

( * ) Notice: Subject to any disclaimer, the term of this patent is extended or adjusted under 35 U.S.C. 154(b) by 299 days.

(21) Appl. No.: 15/977,657

(22) Filed: May 11, 2018

(65) Prior Publication Data

US 2018/0331572 A1 Nov. 15, 2018

Related U.S. Application Data

(60) Provisional application No. 62/504,653, filed on May 11, 2017.

(51) Int. Cl.
| | |
|---|---|
| H02J 13/00 | (2006.01) |
| H03M 11/00 | (2006.01) |
| G05B 19/042 | (2006.01) |
| H05B 47/19 | (2020.01) |
| H02J 3/14 | (2006.01) |

(52) U.S. Cl.
CPC ...... *H02J 13/0075* (2013.01); *G05B 19/0423* (2013.01); *H03M 11/003* (2013.01); *H05B 47/19* (2020.01); G05B 2219/25196 (2013.01); G05B 2219/2642 (2013.01); H01H 2300/03 (2013.01); H01H 2300/04 (2013.01); H02J 3/14 (2013.01); H02J 2310/14 (2020.01)

(58) Field of Classification Search
CPC ...... H02J 13/0075; H02J 2310/14; H02J 3/14; H05B 47/19; H05B 37/0272

USPC ........................................................ 307/31
See application file for complete search history.

(56) References Cited

U.S. PATENT DOCUMENTS

| | | | |
|---|---|---|---|
| 5,248,919 | A | 9/1993 | Hanna et al. |
| 5,905,442 | A | 5/1999 | Mosebrook et al. |
| 8,009,042 | B2 | 8/2011 | Steiner et al. |
| 8,199,010 | B2 | 6/2012 | Sloan et al. |
| 8,228,184 | B2 | 7/2012 | Blakeley et al. |
| 8,330,638 | B2 | 12/2012 | Altonen et al. |
| 8,410,706 | B2 | 4/2013 | Steiner et al. |
| 8,451,116 | B2 | 5/2013 | Steiner et al. |

(Continued)

OTHER PUBLICATIONS

McPhalen, Jon, "Fun with Charlieplexing", Nuts and Volts Magazine, Aug. 2015, pp. 15-19.

*Primary Examiner* — Alfonso Perez Borroto
(74) *Attorney, Agent, or Firm* — Michael Czarnecki; Philip Smith; Glen Farbanish

(57) ABSTRACT

A load control device may be used to control and deliver power to an electrical load. The load control device may comprise a control circuit for controlling the power delivered to the electrical load. The load control device may comprise multiple actuators, where each of the actuators is connected between a terminal of the control circuit and a current regulating device. The number of the actuators may be greater than the number of the terminals. The control circuit may measure signals at the terminals and determine a state configuration for the actuators based on the measured signals. The control circuit may compare the state configuration to a predetermined dataset to detect a ghosting condition.

22 Claims, 7 Drawing Sheets

(56) References Cited

U.S. PATENT DOCUMENTS

| | | | |
|---|---|---|---|
| 8,950,461 B2 | 2/2015 | Adams et al. | |
| 9,115,537 B2 | 8/2015 | Blair | |
| 9,368,025 B2 | 6/2016 | Carmen, Jr. | |
| 10,034,355 B2 * | 7/2018 | Chen | H05B 47/19 |
| 10,360,782 B2 * | 7/2019 | Gray | H05B 47/105 |
| 10,477,656 B2 * | 11/2019 | Killo | H05B 47/19 |
| 2008/0111491 A1 | 5/2008 | Spira | |
| 2009/0206983 A1 | 8/2009 | Knode et al. | |
| 2012/0286940 A1 | 11/2012 | Carmen, Jr. et al. | |
| 2013/0030589 A1 | 1/2013 | Pessina et al. | |
| 2014/0132475 A1 | 5/2014 | Bhutani et al. | |
| 2014/0265568 A1 | 9/2014 | Crafts et al. | |
| 2016/0360597 A1 * | 12/2016 | Greene | H05B 47/19 |
| 2018/0160491 A1 * | 6/2018 | Biery | H05B 45/20 |
| 2018/0315287 A1 * | 11/2018 | Gray | G08B 5/36 |
| 2019/0235046 A1 * | 8/2019 | Sugawara | H05B 47/19 |

\* cited by examiner

DETECTING ACTUATIONS OF BUTTONS OF A CONTROL DEVICE

CROSS-REFERENCE TO RELATED APPLICATIONS

This application claims priority to Provisional U.S. Patent Application No. 62/504,653, filed May 11, 2017, the entire disclosure of which is incorporated by reference herein.

BACKGROUND

Home automation systems, which have become increasingly popular, may be used by homeowners to integrate and control multiple electrical and/or electronic devices in their house. For example, a homeowner may connect appliances, lights, blinds, audio systems, thermostats, cable or satellite boxes, security systems, telecommunication systems, or the like to each other via a wireless network. The homeowner may control these devices using a controller or a user interface provided via a phone, a tablet, a computer, and the like directly connected to the network or remotely connected via the Internet. These devices may communicate with each other and the controller to, for example, improve their efficiency, their convenience, and/or their usability.

A controller (e.g., a load control device) may include multiple actuators and a control circuit, where each actuator may be configured to control one or more electrical loads, such as those described with respect to home automation. The control circuit may include an integrated circuit (IC) having a preconfigured number of terminals (e.g., pins), where each actuator is coupled to one or more of the terminals. For example, each actuator may be coupled between two of the terminals or between one of the terminals and a reference (e.g., such as a supply voltage or circuit common). The number of terminals of the control circuit limits the number of actuators of the control device. One way to increase the number of actuators of a load control device without changing the number of terminals of the control circuit is to adopt a multiplexing technique, such as a charlieplexing technique. The charlieplexing technique may enable the reading of up to N(N−1) actuators using N terminals. For example, the charlieplexing technique may enable the reading of up to six actuators using three terminals.

FIG. 1 is a diagram of an example prior art circuit 100 that is configured to perform the charlieplexing technique. The circuit 100 includes a processing device 102 (e.g., microprocessor) that has three terminals 104, 106, 108 (e.g., pins). Since the processing device 102 is configured to perform the charlieplexing technique and includes three terminals 104, 106, 108, the circuit 100 may include up to six actuators 112-122, where each actuator 112-122 is electrically coupled in series with a respective diode 124-134. Further, each actuator 112-122 is electrically coupled between two terminals of terminals 104-108. Each diode 124-134 is configured to conduct current in one direction and block current in the opposite direction. The diodes 124-134 help to ensure that the processing device 102 can distinguish which actuator 112-122 is being actuated. For example, the path from terminal 108 to terminal 104 passes through actuator 120 but not through actuator 122, because diode 134 blocks current from flowing from terminal 108 to terminal 104. In another example, the path from terminal 106 to terminal 108 passes through actuator 118 but not through actuator 116, because diode 128 blocks current from flowing from terminal 106 to terminal 108. As such, the processing device 102 can determine whether a particular actuator 112-122 is actuated by pulling down terminals (e.g., terminals 104, 106) and driving one terminal (e.g., terminal 108) high towards a supply voltage. The processing device 102 may measure the states at terminals that are pulled down (e.g., terminals 104, 106). For example, if the processing device 102 measures that terminal 104 is in a high state, then the processing device 102 may determine that actuator 120 is actuated (e.g., as shown in FIG. 1). For further example, if the processing device 102 pulls down terminals 104 and 108, drives terminal 106 high towards the supply voltage, and measures that terminal 108 is in a high state, then the processing device 102 may determine that the actuator 118 is actuated.

However, by simply reading the states of terminals to determine whether an actuator is being actuated, the processing device 102 may erroneously determine that a particular actuator has been actuated when in fact multiple actuators have been actuated. This may be referred to as a ghosting condition and result in a faulty operation by the circuit 100. A ghosting condition may occur when there are multiple current paths between the two terminals, for example, by actuation of multiple actuators. For example, if actuators 112 and 116 are pressed (e.g., the user accidently hits two buttons at once), the processing device 102 may erroneously determine that actuator 120 has been pressed and the circuit 100 may perform the associated function. In this example, the processing device 102 may drive terminal 108 high and determine that terminal 104 is in a high state. The processing device 102 may associate this state configuration with the actuation of actuator 120 even though actuator 120 was not actuated by the user.

SUMMARY

A load control device may be used to control and deliver power to an electrical load. The load control device may comprise a control circuit for controlling the power delivered to the electrical load via multiple terminals. The load control device may comprise an actuator input circuit including multiple actuators that are coupled between the terminals and devices that allow current to pass in one direction and blocks the current in the opposite direction. The number of the actuators may be greater than the number of the terminals. The control circuit may measure a signal at a terminal connected with an actuator and compare the measured signal to a threshold that is calculated from a voltage drop caused by the device. The control circuit may determine that the actuator connected with the terminal has been actuated when the measured signal is less than the threshold calculated from the voltage drop of the device. The device may be a diode and the voltage drop may be a diode drop. The threshold may be calculated from a single diode drop and a supply voltage signal of the control circuit.

The control circuit may compare the measured signal to a threshold calculated from more than one voltage drops when the measured signal is no less than the threshold calculated from the single diode drop. The control circuit may mark the actuator as quarantined when the measured signal is less than the threshold calculated from more than one voltage drops, or mark the actuator as open when the measured signal is no less than the threshold calculated from more than one voltage drops. The control circuit may continue to determine whether the other actuators are activated. The control circuit may determine an error occurs when the actuators that are actuated are associated with an invalid current path.

DETAILED DESCRIPTION

Figure 1:
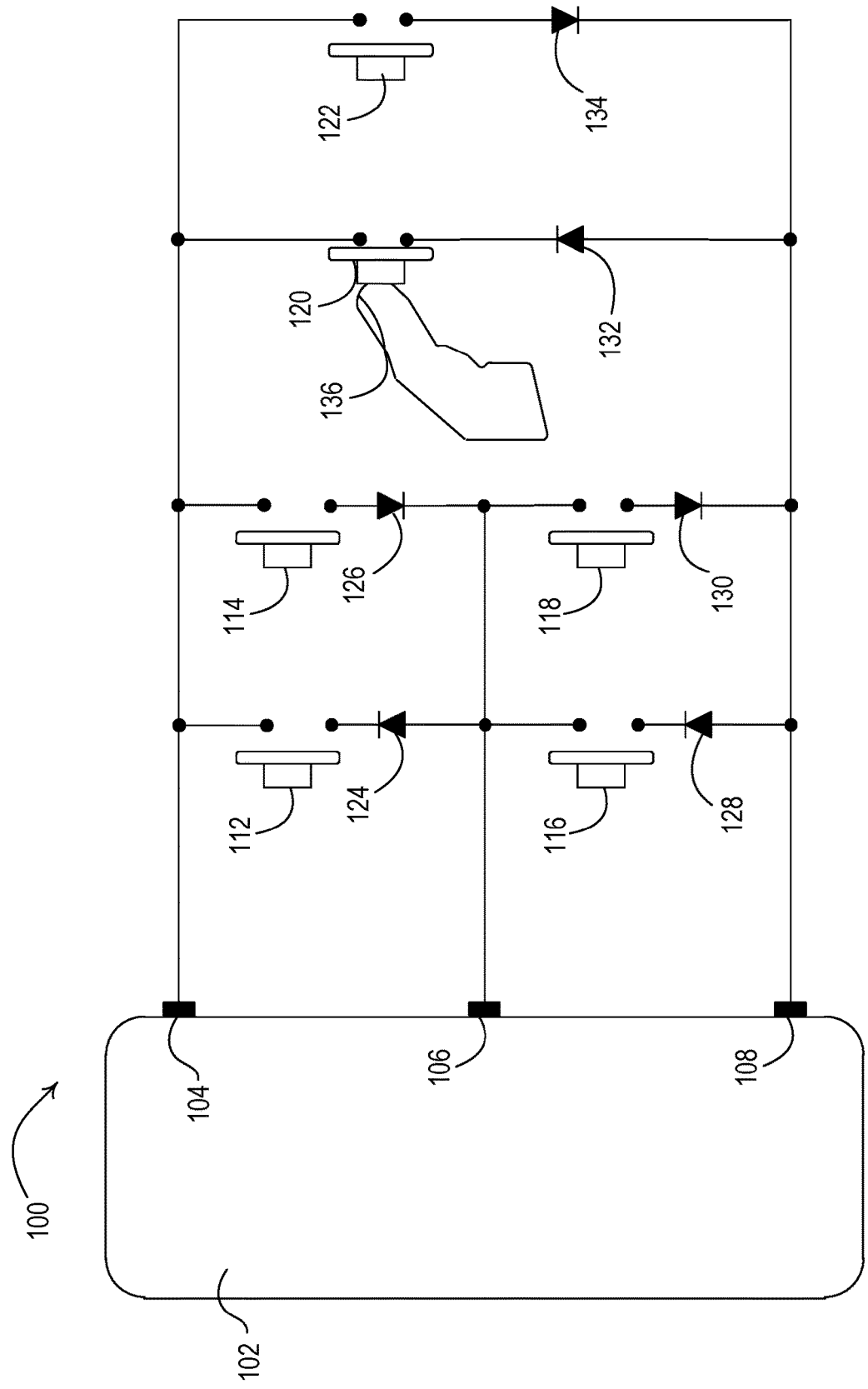
FIG. 1 is a diagram of a prior art load control device that is configured to perform charlieplexing.
Figure 2:
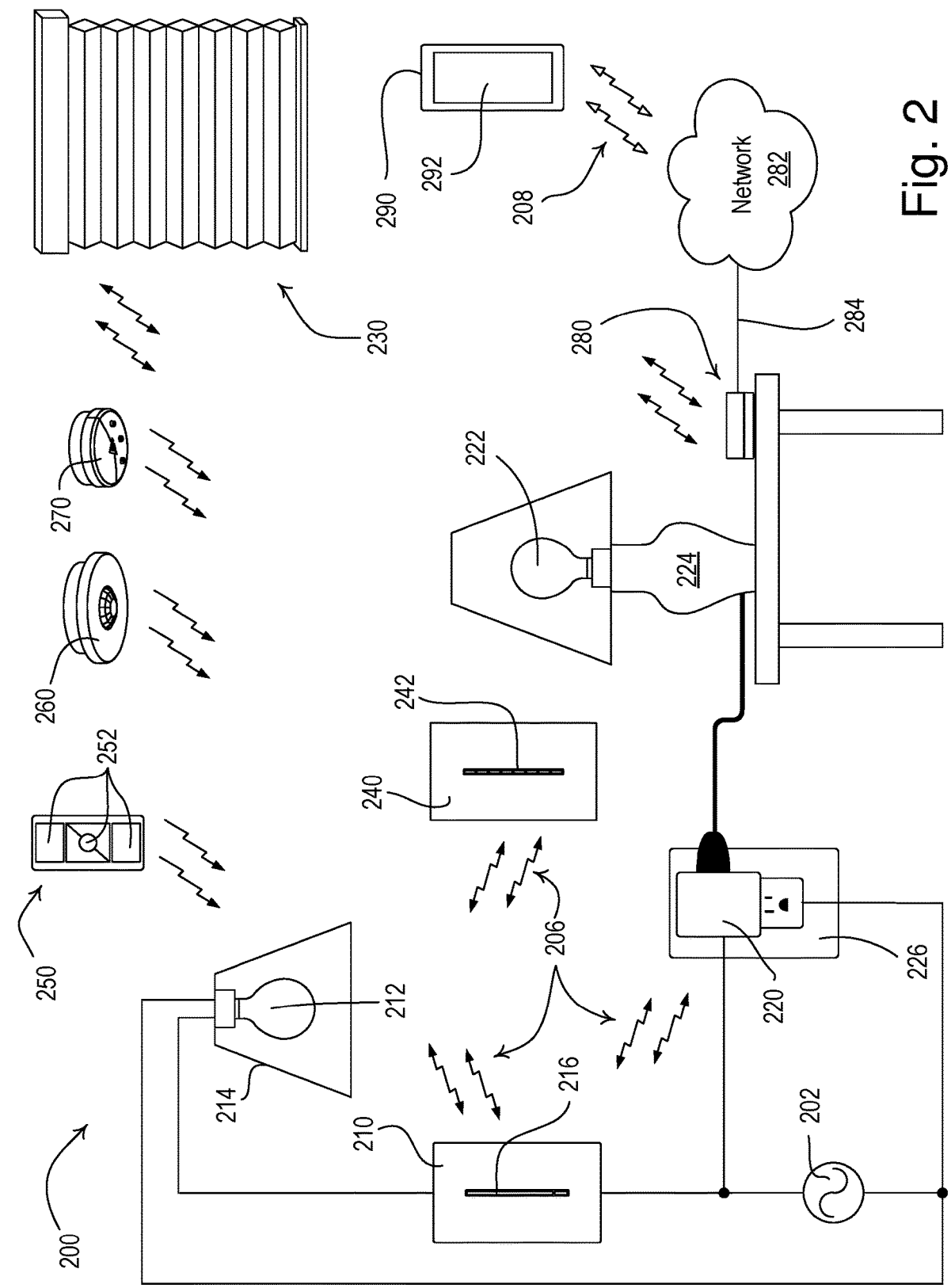
FIG. 2 is a diagram of an example of a load control system comprising various load control devices and electrical loads.

FIG. 2 is a simple diagram of an example load control system 200 (e.g., a lighting control system) in which one or more input devices such as a wall-mounted remote control device 240 (e.g., the load control device 300, and/or other example load control devices described herein) may be deployed. The wall-mounted remote control device 240 may include one or more actuation members 242. The wall-mounted remote control device 240 may not be directly connected to an electrical load, and as such, may not include an internal load control circuit.

The wall-mounted remote control device 240 may transmit signals, e.g., radio-frequency (RF) signals 206, in response to actuations of one or more of the actuation members 242. For example, the remote control device 240 may transmit the RF signals 206 to an electrical load(s) and/or to a load control device(s) (e.g., which is directly or indirectly connected to an electrical load) for controlling one or more characteristics of the electrical load (e.g., such as light intensity, light color and/or color temperature, volume, shade level, temperature, fan speed, etc.). In an example, a wall-mounted load control device 210 may be configured to receive the RF signals 206 transmitted by the wall-mounted remote control device 240 to control a light bulb 212 in response to the actuation of a member of the plurality of actuation members 242 of the wall-mounted remote control device 240. For example, the RF signals 206 may be transmitted at a communication frequency $f_{RF}$ (e.g., approximately 434 MHz) using a proprietary RF protocol, such as the ClearConnect® protocol. The remote control device 240 may transmit RF signals 206 at one or more communication frequencies, such as, for example, 2.4 GHz or 5.6 GHz. The RF signals 206 may be transmitted using a different RF protocol, such as, for example, one of WIFI, ZIGBEE, Z-WAVE, BLUETOOTH, THREAD, KNX-RF, ENOCEAN RADIO protocols, or a different proprietary protocol.

The actuation members 242 of the wall-mounted remote control device 240 (e.g., a wall-mounted keypad device) may actuated to select one or more presets or scenes, such as "All on," "Welcome," "Day," "Patio," "Evening," "Entertain," "Goodnight," or "Night Light." Each of the presets or scenes may be associated with unique operational settings of one or more electrical loads. An operational setting of an electrical load may include, for example, a light intensity, a light color, a light color temperature, a volume level, an HVAC setting (e.g., temperature, fan speed, etc.), a window treatment setting, and/or the like. A user may configure the scenes of the wall-mounted remote control device 240, for example, by placing the wall-mounted remote control device 240 into a special programming mode, via a network device 290, such as a smartphone, and/or the like.

The wall-mounted load control device 210 may be coupled in series between an AC power source 202 and a first lighting load, e.g., first light bulb 212 that may be installed in a ceiling mounted downlight fixture 214. The first light bulb 212 may be installed in a wall-mounted lighting fixture or other lighting fixture mounted to another surface. The wall-mounted load control device 210 may be adapted to be wall-mounted in a standard electrical wallbox. The load control system 200 may include another load control device, e.g., a plug-in load control device 220. The plug-in load control device 220 may be coupled in series between the AC power source 202 and a second lighting load, e.g., a second light bulb 222 installed in a lamp (e.g., a table lamp 224). The plug-in load control device 220 may be plugged into an electrical receptacle 226 that is powered by the AC power source 202. The table lamp 224 may be plugged into the plug-in load control device 220. The second light bulb 222 may be installed in a table lamp or other lamps that may be plugged into the plug-in load control device 220. The plug-in load control device 220 may be implemented as a table-top load control device, or a remotely-mounted load control device.

The wall-mounted load control device 210 may include a touch sensitive actuator 216 for controlling the first light bulb 212. In response to actuation of the touch sensitive actuator 216, the wall-mounted load control device 210 may be configured to turn the first light bulb 212 on and off, and to increase or decrease the amount of power delivered to the first light bulb. The wall-mounted load control device 210 may vary the intensity of the light bulb by varying the amount of power delivered to the light bulb. The wall-mounted load control device 210 may increase or decrease the intensity of the light bulb from a minimum intensity (e.g., approximately 1%) to a maximum intensity (e.g., approximately 100%). The wall-mounted load control device 210 may be configured to provide visual indicators. The visual indicators may be arranged in a linear array on the touch sensitive actuator 216. The wall-mounted load control device 210 may be configured to illuminate the visual indicators to provide feedback of the intensity of the first light bulb 212. Examples of wall-mounted dimmer switches are described in greater detail in U.S. Pat. No. 5,248,919, issued Sep. 28, 1993, entitled LIGHTING CONTROL DEVICE, and U.S. Patent Application Publication No. 2014/0132475, published May 15, 2014, entitled WIRELESS LOAD CONTROL DEVICE, the entire disclosures of which are hereby incorporated by reference.

The load control system 200 may include a daylight control device, e.g., a motorized window treatment 230, mounted in front of a window for controlling the amount of daylight entering the space in which the load control system 200 is installed. Examples of battery-powered motorized window treatments are described in greater detail in commonly-assigned U.S. Pat. No. 8,950,461, issued Feb. 10, 2015, entitled MOTORIZED WINDOW TREATMENT, and U.S. Pat. No. 9,115,537, issued Aug. 25, 2015, entitled BATTERY-POWERED ROLLER SHADE SYSTEM, the entire disclosures of which are hereby incorporated by reference.

The one or more input devices (e.g., RF transmitters) in the load control system 200 may include also a battery-powered handheld remote control device 250, an occupancy sensor 260, or a daylight sensor 270. The wall-mounted load control device 210 and/or the plug-in load control device 220 may be configured to receive digital messages via the RF signals 206. The wireless signals may be transmitted by the wall-mounted remote control device 240, the battery-powered remote control device 250, the occupancy sensor 260, or the daylight sensor 270. In response to the received digital messages, the wall-mounted load control device 210 and/or the plug-in load control device 220 may be configured to turn the respective light bulbs 212, 222 on and off, and to increase or decrease the intensity of the respective light bulbs. The wall-mounted load control device 210 and/or the plug-in load control device 220 may be implemented as electronic switches configured to turn on and off (e.g., only turn on and off) the respective light bulbs 212, 222.

The battery-powered remote control device 250 may include one or more actuators 252 (e.g., one or more of an on button, an off button, a raise button, a lower button, and a preset button). The battery-powered remote control device 250 may transmit RF signals 206 in response to actuations of one or more of the actuators 252. The battery-powered remote control device 250 may be handheld. The battery-powered remote control device 250 may be mounted vertically to a wall or supported on a pedestal for placement on a tabletop. Examples of battery-powered remote control devices are described in greater detail in commonly-assigned U.S. Pat. No. 8,330,638, issued Dec. 11, 2012, entitled WIRELESS BATTERY-POWERED REMOTE CONTROL HAVING MULTIPLE MOUNTING MEANS, and U.S. Patent Application Publication No. 2012/0286940, published Nov. 15, 2012, entitled CONTROL DEVICE HAVING A NIGHTLIGHT, the entire disclosures of which are hereby incorporated by reference.

The occupancy sensor 260 may be configured to detect occupancy and vacancy conditions in the space in which the load control system 200 is installed. The occupancy sensor 260 may transmit digital messages to the wall-mounted load control device 210 and/or the plug-in load control device 220 via the RF signals 206 in response to detecting the occupancy or vacancy conditions. Each of the wall-mounted load control device 210 and/or the plug-in load control device 220 may be configured to turn on the respective light bulb 212, 222 in response to receiving an occupied command. The wall-mounted load control device 210 and/or the plug-in load control device 220 may be configured to turn off the respective light bulb in response to receiving a vacant command. Examples of RF load control systems having occupancy and vacancy sensors are described in greater detail in commonly-assigned U.S. Pat. No. 8,009,042, issued Aug. 30, 2011 Sep. 3, 2008, entitled RADIO-FREQUENCY LIGHTING CONTROL SYSTEM WITH OCCUPANCY SENSING; U.S. Pat. No. 8,199,010, issued Jun. 12, 2012, entitled METHOD AND APPARATUS FOR CONFIGURING A WIRELESS SENSOR; and U.S. Pat. No. 8,228,184, issued Jul. 24, 2012, entitled BATTERY-POWERED OCCUPANCY SENSOR, the entire disclosures of which are hereby incorporated by reference.

The daylight sensor 270 may be configured to measure a total light intensity in the space in which the load control system 200 is installed. The daylight sensor 270 may transmit digital messages including the measured light intensity to the wall-mounted load control device 210 and/or the plug-in load control device 220. The daylight sensor 270 may transmit digital messages via the RF signals 206 for controlling the intensities of the respective light bulbs 212, 222 in response to the measured light intensity. Examples of RF load control systems having daylight sensors are described in greater detail in commonly-assigned U.S. Pat. No. 8,410,706, issued Apr. 2, 2013, entitled METHOD OF CALIBRATING A DAYLIGHT SENSOR; and U.S. Pat. No. 8,451,116, issued May 28, 2013, entitled WIRELESS BATTERY-POWERED DAYLIGHT SENSOR, the entire disclosures of which are hereby incorporated by reference.

Digital messages transmitted by the input devices (e.g., the wall-mounted remote control device 240, the battery-powered remote control device 250, the occupancy sensor 260, and the daylight sensor 270) may include a command and/or identifying information. Each of the input devices may be assigned to the wall-mounted load control device 210 and/or the plug-in load control device 220 during a configuration procedure of the load control system 200, such that the wall-mounted load control device 210 and/or the plug-in load control device 220 are responsive to digital messages transmitted by the input devices via the RF signals 206. Examples of methods of associating wireless control devices are described in greater detail in commonly-assigned U.S. Patent Application Publication No. 2008/0111491, published May 15, 2008, entitled RADIO-FREQUENCY LIGHTING CONTROL SYSTEM, and U.S. Pat. No. 9,368,025, issued Jun. 14, 2016, entitled TWO-PART LOAD CONTROL SYSTEM MOUNTABLE TO A SINGLE ELECTRICAL WALLBOX, the entire disclosures of which are hereby incorporated by reference.

The load control system 200 may include a gateway device 280 (e.g., a bridge and/or a system controller) configured to enable communication with a network 282, e.g., a wireless or wired local area network (LAN). The gateway device 280 may be connected to a router (not shown) via a wired digital communication link 284 (e.g., an Ethernet communication link). The router may allow for communication with the network 282, e.g., for access to the Internet. The gateway device 280 may be wirelessly connected to the network 282, e.g., using Wi-Fi technology.

The gateway device 280 may be configured to transmit RF signals 206 to the wall-mounted load control device 210 and/or the plug-in load control device 220 (e.g., using the proprietary protocol) for controlling the respective light bulbs 212, 222 in response to digital messages received from external devices via the network 282. The gateway device 280 may be configured to receive RF signals 206 from the wall-mounted load control device 210, the plug-in load control device 220, the motorized window treatment 230, the wall-mounted remote control device 240, the battery-powered remote control device 250, the occupancy sensor 260, and/or the daylight sensor 270 (e.g., using the proprietary protocol). The gateway device 280 may be configured to transmit digital messages via the network 282 for providing data (e.g., status information) to external devices. The gateway device 280 may operate as a central controller for the load control system 200, or may simply relay digital messages between the control devices of the load control system and the network 282.

The load control system 200 may include a network device 290, such as, a smart phone (for example, an iPhone® smart phone, an Android® smart phone, or a Blackberry® smart phone), a personal computer, a laptop, a wireless-capable media device (e.g., MP3 player, gaming device, or television), a tablet device, (for example, an iPad® handheld computing device), a Wi-Fi or wireless-communication-capable television, or any other suitable Internet-Protocol-enabled device. The network device 290 may be operable to transmit digital messages in one or more Internet Protocol packets to the gateway device 280 via RF signals 208 either directly or via the network 282. For example, the network device 290 may transmit the RF signals 208 to the gateway device 280 via a Wi-Fi communication link, a Wi-MAX communications link, a Bluetooth® communications link, a near field communication (NFC) link, a cellular communications link, a television white space (TVWS) communication link, or any combination thereof. Examples of load control systems operable to communicate with network devices on a network are described in greater detail in commonly-assigned U.S. Patent Application Publication No. 2013/0030589, published Jan. 31, 2013, entitled LOAD CONTROL DEVICE HAVING INTERNET CONNECTIVITY, the entire disclosure of which is hereby incorporated by reference.

The network device 290 may include a visual display 292. The visual display 292 may include a touch screen that may include, for example, a capacitive touch pad displaced overtop the visual display, such that the visual display may display soft buttons that may be actuated by a user. The network device 290 may include a plurality of hard buttons, e.g., physical buttons (not shown), in addition to the visual display 292. The network device 290 may download a product control application for allowing a user of the network device to control the load control system 200. In response to actuations of the displayed soft buttons or hard buttons, the network device 290 may transmit digital messages to the gateway device 280 through the wireless communications described herein. The network device 290 may transmit digital messages to the gateway device 280 via the RF signals 208 for controlling the wall-mounted load control device 210 and/or the plug-in load control device 220. The gateway device 280 may be configured to transmit RF signals 208 to the network device 290 in response to digital messages received from the wall-mounted load control device 210, the plug-in load control device 220, the motorized window treatment 230, the wall-mounted remote control device 240, the battery-powered remote control device 250, the occupancy sensor 260, and/or the daylight sensor 270 (e.g., using the proprietary protocol) for displaying data (e.g., status information) on the visual display 292 of the network device.

The operation of the load control system 200 (e.g., the association between the input devices and/or remote control devices and the load control devices, the presets, etc.) may be programmed and configured using the gateway device 280 and/or network device 290. An example of a configuration procedure for a wireless load control system is described in greater detail in commonly-assigned U.S. Patent Publication No. 2014/0265,568, published Sep. 18, 2014, entitled COMMISSIONING LOAD CONTROL SYSTEMS, the entire disclosure of which is hereby incorporated by reference. Examples of wireless load control systems are described in greater detail in commonly-assigned U.S. Pat. No. 5,905,442, issued May 18, 1999, entitled METHOD AND APPARATUS FOR CONTROLLING AND DETERMINING THE STATUS OF ELECTRICAL DEVICES FROM REMOTE LOCATIONS; and U.S. Patent Application Publication No. 2009/0206983, published Aug. 20, 2009, entitled COMMUNICATION PROTOCOL FOR A RADIO-FREQUENCY LOAD CONTROL SYSTEM, the entire disclosures of all of which are hereby incorporated by reference.

Figure 3:
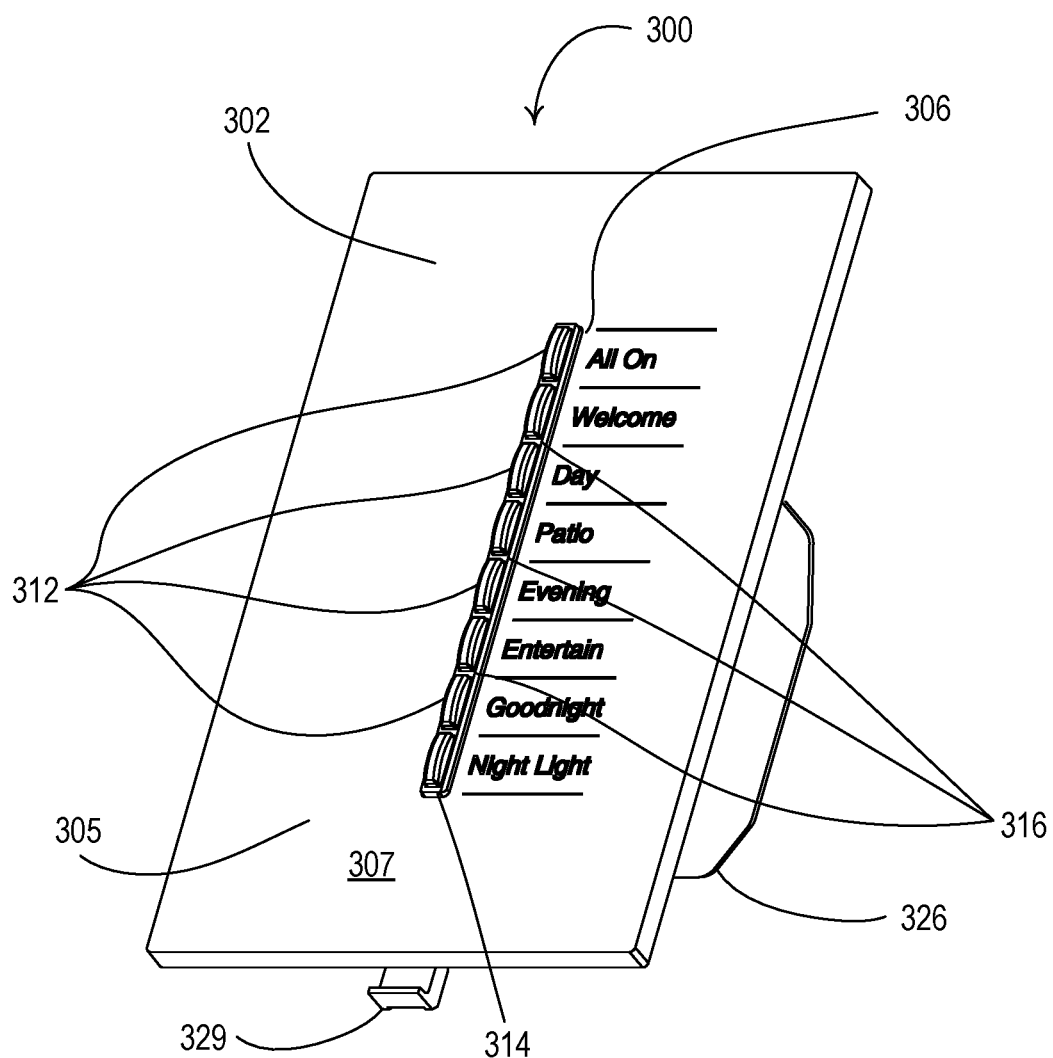
FIG. 3 is a perspective view of an example of a load control device.

FIG. 3 is a perspective view of an example load control device 300. The example load control device 300 may be configured to operate as a wall-mounted remote control device (e.g., such as the wall-mounted remote control device 240) of a load control system (e.g., the load control system 200 shown in FIG. 2). The load control device 300 may include one or more actuation members 312 for controlling an electrical load (e.g., a lighting load). The actuation members 312 may be examples of the plurality of actuation members 242. The one or more actuation members 312 may be provided as a keypad.

The load control device 300 may include a bezel 314. The bezel 314 may be shaped to form one or more openings separated by one or more dividers 316, through which the front surface of the one or more actuation members 312 or different portions of an actuation member (e.g., when an actuation member has an upper portion and a lower portion) may extend. The load control device 300 may be used for controlling the power delivered from an alternating-current (AC) source to an electrical load (e.g., a lighting load).

The load control device 300 may comprise a faceplate 302, an air-gap actuator 329, and an enclosure 326. The faceplate 302 may define a planar front surface of the load control device 300 and may have an opening 306 for receiving the bezel 314 and one or more actuation members 312 that are configured to receive user inputs. The opening 306 may be adapted to receive the one or more actuation members 312, for example, when the faceplate 302 is installed on the wireless control device 300. The one or more actuation members 312 may be arranged along a longitudinal axis of the load control device 300. The faceplate 302 may comprise a light-conductive body portion 305 and opaque material provided on a front surface 307 of the faceplate. Indicia (e.g., text and/or graphics) may be engraved in the opaque material and be illuminated by one or more light sources residing behind the body portion 305 and within the load control device 300.

The one or more actuation members 312 may be buttons and may be made of a non-conductive material, such as plastic or glass, or of a conductive material, such as a metallic sheet attached to a plastic carrier. The one or more actuation members 312 may each be designated to select one or more operational settings (e.g., presets, scenes, and/or predetermined light intensities) associated with a specific use scenario, such as "Welcome," "Day," "Entertain," or "Goodnight." An operational setting may refer to predetermined and/or configurable operational parameters of one or more electrical loads, for example, light intensity, HVAC setting (e.g., temperature), window treatment setting, and/or the like. The specific use scenario associated with each of the actuation members 312 may be indicated, for example, by placing labels next to the actuation members 312 describing their associated use scenarios, such as "Welcome," "Day," "Entertain," or "Goodnight." The load control device 300 may be configured to transmit RF signals to one or more load control devices and/or one or more electrical loads in response to actuations of the actuation members 312.

Figure 4:
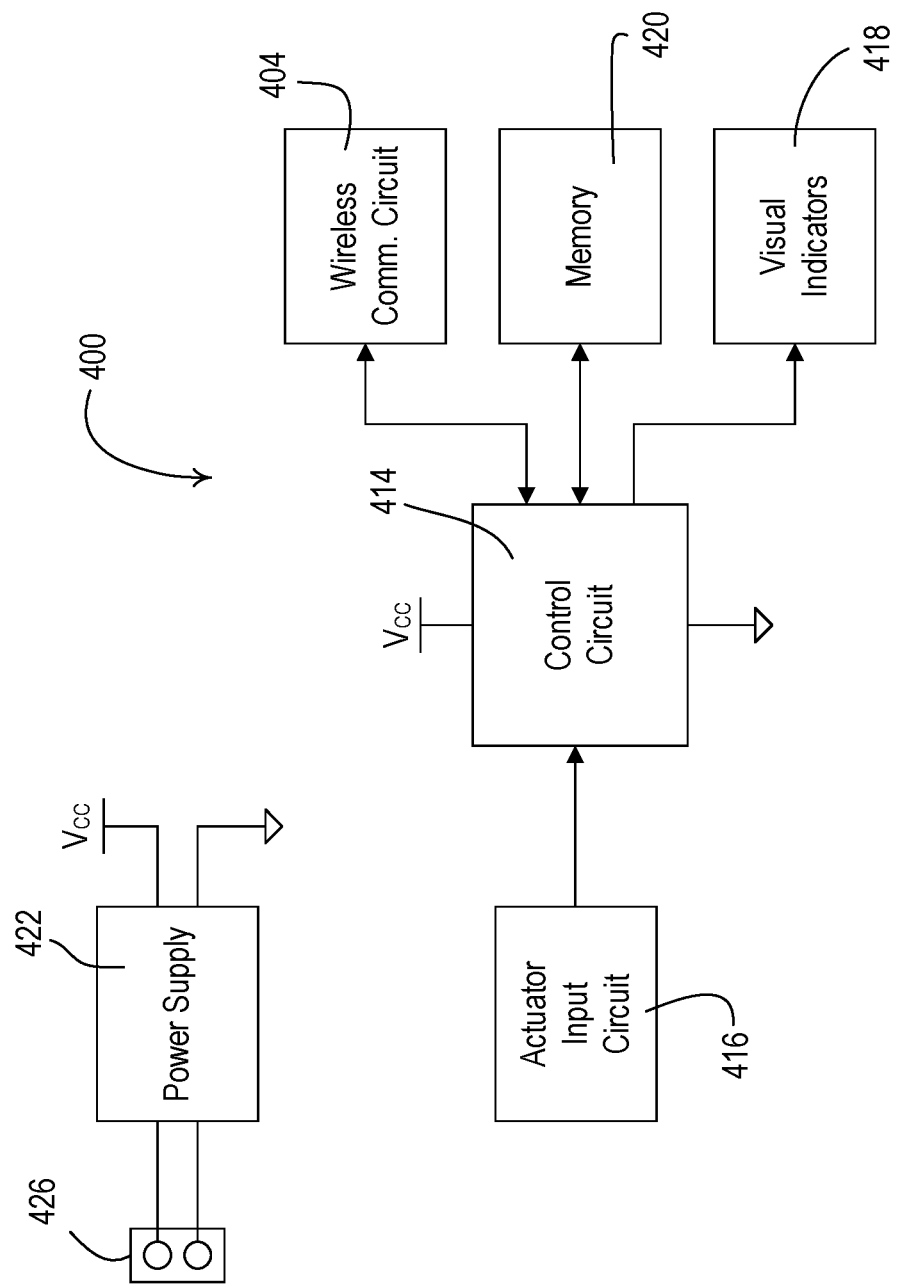
FIG. 4 is a simplified block diagram of an example of a load control device.

FIG. 4 is a simplified block diagram of an example control device 400, which may be implemented as a load control device (e.g., the remote load control device 240, the load control device 300, etc.) and/or remote input device (e.g., the remote control device 250). The control device 400 may comprise a control circuit 414, a wireless communication circuit 404, a memory 420, an actuator input circuit 416, one or more visual indicators 418, a power supply 422, and a power supply connector 426.

The control circuit 414 may include one or more of a processor (e.g., a microprocessor), a microcontroller, a programmable logic device (PLD), a field programmable gate array (FPGA), an application specific integrated circuit (ASIC), or any suitable processing device. The control circuit 414 may perform signal coding, data processing, power control, input/output processing, and/or any other functionality that enables the control device 400 to perform as described herein.

The wireless communication circuit 404 may include an RF transceiver coupled to an antenna for transmitting and/or receiving RF signals. The wireless communication circuit 404 may communicate via a Wi-Fi communication link, a Wi-MAX communications link, a Bluetooth® communications link, a near field communication (NFC) link, a cellular communications link, a television white space (TVWS) communication link, a proprietary protocol (e.g., the ClearConnect® protocol), or any combination thereof. The control circuit 414 may be coupled to the wireless communication circuit 404 for transmitting digital messages via the RF signals, for example, to control load control devices in the load control environment in response to received digital messages. The control circuit 414 may be configured to receive digital messages, for example, from the load control devices and/or the input devices. The control circuit 414 may be configured to transmit RF signals upon an actuator of actuator input circuit 416 being actuated.

The control circuit 414 may respond to actuations of the actuator input circuit 416. For example, the control circuit 414 may be operable to associate the control device 400 with one or more control devices in response to actuations of the actuator input circuit 416 during a configuration procedure of a load control system. The control circuit 414 may individually control the visual indicators 418 in response to actuations of the actuator input circuit 416, for example, to illuminate a linear array of visual indicators on a load control device.

The control circuit 414 may store information in and/or retrieve information from the memory 420. The memory 420 may include a non-removable memory and/or a removable memory for storing computer-readable media. The non-removable memory may include random-access memory (RAM), read-only memory (ROM), a hard disk, and/or any other type of non-removable memory storage. The removable memory may include a subscriber identity module (SIM) card, a memory stick, a memory card (e.g., a digital camera memory card), and/or any other type of removable memory. The control circuit 414 may access the memory 420 for executable instructions and/or other information that may be used by the control device 400. The memory 420 may be communicatively coupled to the control circuit 414 for the storage and/or retrieval of, for example, operational settings, such as, a dataset indicating valid current paths between multiple integrated circuit terminals of the control circuit 414. The memory 420 may be implemented as an external integrated circuit (IC) or as an internal circuit of the control circuit 414.

The control circuit 414 may illuminate a visual indicator 418 to provide feedback to a user of a load control system. For example, the control circuit 414 may blink or strobe the visual indicator 418 to indicate a fault condition. The control circuit 414 may be operable to illuminate the visual indicator 418 with different colors to indicate different conditions or states of the control device 400. The visual indicator 418 may be illuminated by, for example, one or more light-emitting diodes (LEDs). The control device 400 may include more than one visual indicator.

The control device 400 may include a power supply 422 for generating a DC supply voltage $V_{CC}$ for powering the control circuit 414, the wireless communication circuit 416, the memory 420, the visual indicator 418, and/or other circuitry of the control device 400. The power supply 422 may be coupled to the power supply connector 426 (e.g., a USB port) for receiving a supply voltage (e.g., a DC voltage) and/or for drawing current from an external power source.

Each actuator may be configured to control one or more electrical loads via the wireless communication circuit 404. Further, the actuator input circuit 416 may be associated with a different action for the same load(s) (e.g., different intensity levels for one or more lighting loads) and/or associated with different load(s) (e.g., lighting loads, an HVAC system, motorized window treatments, and/or the like). For example, a first actuator may control a first group of lighting loads to a first level and window treatments to a preset level, and a second actuator may control the first group of lighting loads to a second level and a second group of lighting loads to a set level. Additionally, the actuation of a particular combination of actuators may perform a special function, such as placing the control device 400 into an advanced programming mode. Once in the advanced programming mode, a user may configure the actuator input circuit 416 of the control device 400 to control different electrical loads of the system (e.g., the load control system 200) and/or control one or more electrical loads to a different level (e.g., intensity).

The control circuit 414 (e.g., a processor of the control circuit) may comprise multiple terminals, which may be used to couple the control circuit 414 to the actuator input circuit 416. The number of actuators may be greater than the number of terminals, and, for example, the control circuit 400 may include N terminals and up to N(N−1) actuators, where each terminal is connected to one or more actuators. Further, each actuator of the actuator input circuit 416 may be associated with a current regulating device, such as a blocking semiconductor device (e.g., a diode).

The control circuit 414 may be configured to detect occurrences of ghosting conditions. For example, the control circuit 414 may apply a signal (e.g., an electrical current and/or voltage) to one or more terminals, measure a received signal at one or more terminals, and compare the received signals to one or more predetermined thresholds to determine whether a ghosting condition has occurred (e.g., as described herein). For example, the control circuit 414 may be configured to pull down one or more terminals and measure a voltage (e.g., voltage potential) at each of the terminals to determine a state for each of the terminals. The current signal may flow through a current path between the first and second terminals, and there may be one or more actuators (e.g., and associated current regulating devices) coupled between the two terminals along the current path. An analog voltage may be measured at one of the terminals and compared to one or more thresholds to detect the ghosting condition. As described herein, the thresholds may be determined based on characteristics of the current regulating devices of the control device 400. For example, the thresholds may be determined based on one or more diode drops (e.g., voltage drops across the diodes of the control device 400) if the current regulating devices are diodes.

Figure 5:
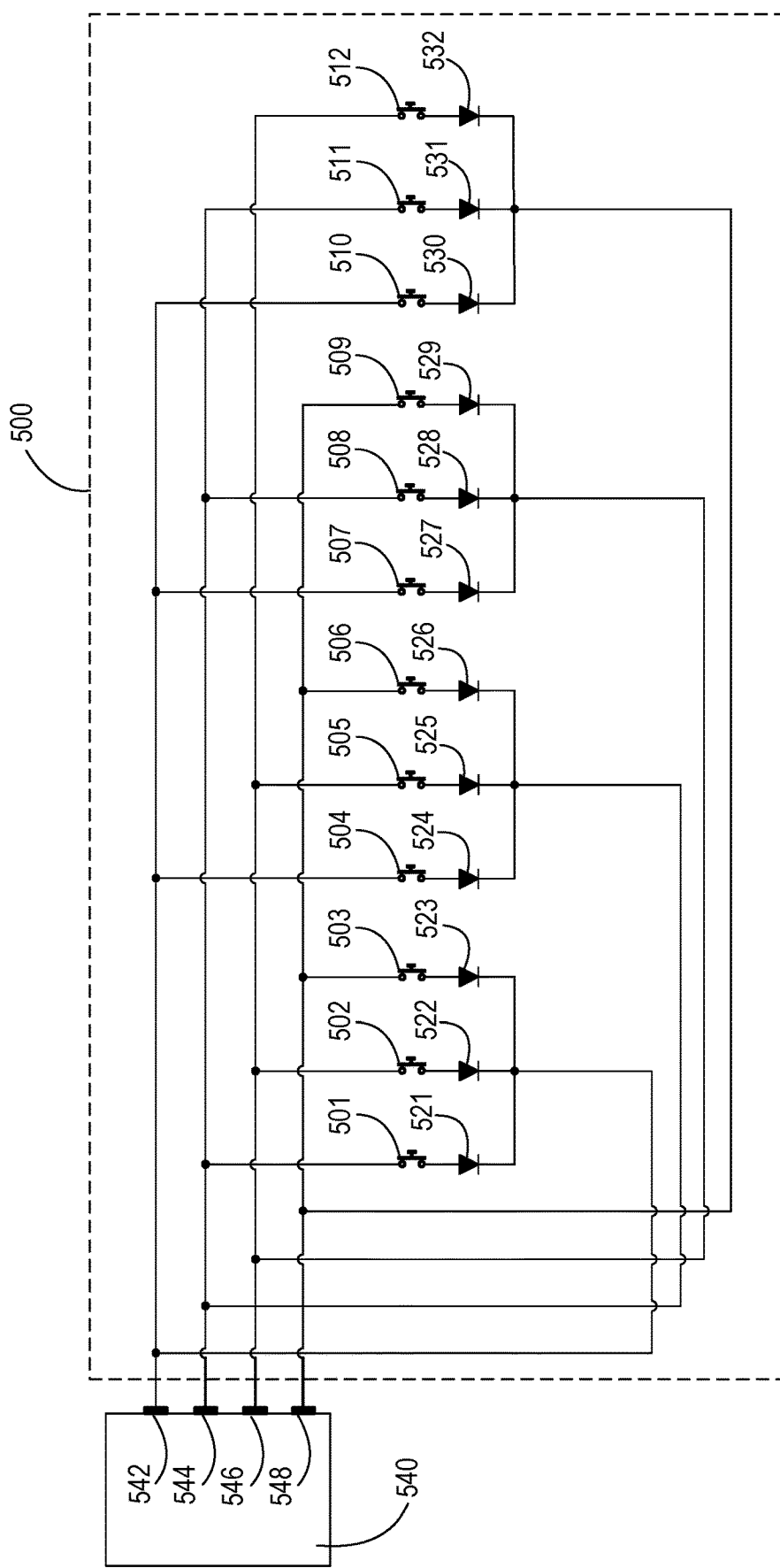
FIG. 5 is a diagram of an example of an actuator input circuit and a control circuit that is configured to perform a charlieplexing technique and detect a ghosting condition.

FIG. 5 is a diagram of an example actuator input circuit 500 and an example control circuit 540 that may be configured to perform a charlieplexing technique and detect ghosting conditions. The control circuit 540 may be an example of the control circuit 414 of the control device 400, and the actuator input circuit 500 may be an example of the actuator input circuit 416 of the control device 400. The control circuit 540 (e.g., a processor, such as a microprocessor) may include a plurality of terminals 542-548. The control circuit 540 may include an analog-to-digital converter (ADC) (e.g., or multiple comparators). The control circuit 540 may configure each of the terminals 542-548 as an input terminal or an output terminal. When one of the terminals 542-548 is configured as an output terminal, the control circuit 540 may be configured to "short" the terminal to the supply voltage (e.g., the supply voltage $V_{CC}$) and/or circuit common, e.g., through respective internal field-effect transistors (FETs). When one of the terminals 542-548 is configured as an input terminal, the control circuit 540 may be configured to pull the terminal up towards the supply voltage and/or pull the terminal down towards circuit common through respective internal resistors (e.g., pull-up and pull-down resistors). In addition, when one of the terminals 542-548 is configured as an input terminal, the control circuit 540 may be configured as a standard logic input (e.g., as either a logic high or a logic low) or an ADC input. The control circuit may also control each of the terminals 542-548 to a high-impedance state in which the terminals are not configured as input or output terminals (e.g., the terminals are not shorted to or pulled towards the supply voltage or circuit common).

As shown in FIG. 5, the four terminals 542-548 of the control circuit 540 may be connected to the actuator input circuit 500. The actuator input circuit 500 may include a plurality of actuators 501-512 and a plurality of respective current regulating devices, such as diodes 521-532. The control circuit 540 may be configured to perform a charlieplexing technique via the terminals 542-548, which may allow the terminals 542-548 of the control circuit 540 to be connected to up to N(N−1) actuators, where N is the number of terminals. The actuator input circuit 500 may comprise a maximum allowable number $N_{MAX}$ of actuators that can be configured for charlieplexing with the terminals 542-548 of the control circuit 540, e.g., where $N_{MAX}$=N(N−1). For example, when the number N of terminals equals 4, the maximum allowable number $N_{MAX}$ of actuators may be 12.

The actuator input circuit 500 may include, for example, one respective diode 521-532 associated with each actuator 501-512. Each actuator 501-512 may be coupled between two of terminals 542-548 and may be coupled in series with one of the diodes 521-532. For example, actuator 501 may be coupled between terminals 544 and 542 and coupled in series with diode 521, and actuator 512 may be coupled between terminals 546 and 548 and coupled in series with diode 532.

Each diode 521-532 may be configured to conduct current in one direction and block current in the opposite direction. The diodes 521-532 may help to ensure that the control circuit 540 can distinguish which actuator(s) 501-512 is being actuated. For example, the path from terminal 544 to terminal 542 may pass through actuator 501 but not through actuator 504, because diode 524 may block current from flowing from terminal 544 to terminal 542. In another example, the path from terminal 546 to terminal 548 may pass through actuator 512 but not through actuator 509, because diode 529 may block current from flowing from terminal 548 to terminal 546.

In order to determine if a particular actuator of the actuators 501-512 is presently being actuated, the control circuit 540 may configure the terminals 542-548 to predetermined states before reading one of the terminals. For example, the control circuit 540 may configure a first terminal that is connected to the cathode of the diode in series with the particular actuator as an output, and may short the terminal to circuit common. The control circuit 540 may configure a second terminal that is connected to the anode of the diode in series with the particular actuator as an input that is pulled up towards the supply voltage through an internal pull-up resistor, and may configure the second terminal as an ADC input. In addition, the control circuit 540 may configure each of the remaining terminals to the high-impedance state.

When the terminals 542-548 are configured correctly for the particular actuator, the control circuit 540 may measure the magnitude of the voltage at the second terminal that is configured as an input pulled up towards the supply voltage through a pull-up resistor. If the magnitude of the voltage at the second terminal is high (e.g., at approximately the supply voltage), the control circuit 540 may determine that the particular actuator is not presently being actuated. If the magnitude of the voltage at the second terminal is not high, but rather low (e.g., approximately a diode drop above circuit common, such as 0.7 volts), the control circuit 540 may determine that the particular actuator may presently be being actuated.

Table 1 is an example of the state configurations for the terminals 542-548 (e.g., Output Low, Input Pulled Up, and High Impendence (High Z)) when the control circuit 540 is trying to determine if one of the actuators 501-512 is presently being actuated. The control circuit 540 may configure the terminals 542-548 as shown in Table 1 for a particular actuator and measure the magnitude of the voltage at the terminals that is configured as an input pulled up towards the supply voltage in order to determine if the particular actuator in presently being actuated. The control circuit 540 may step through each actuator 501-512 and repeat the process to determine if that actuator is presently being actuated.

TABLE 1

Example state configurations at the terminals

| Actuator | Terminal 542 | Terminal 544 | Terminal 546 | Terminal 548 |
|---|---|---|---|---|
| 501 | Output Low | Input Pulled Up | High Z | High Z |
| 502 | Output Low | High Z | Input Pulled Up | High Z |
| 503 | Output Low | High Z | High Z | Input Pulled Up |
| 504 | Input Pulled Up | Output Low | High Z | High Z |
| 505 | High Z | Output Low | Input Pulled Up | High Z |
| 506 | High Z | Output Low | High Z | Input Pulled Up |
| 507 | Input Pulled Up | High Z | Output Low | High Z |
| 508 | High Z | Input Pulled Up | Output Low | High Z |
| 509 | High Z | High Z | Output Low | Input Pulled Up |
| 510 | Input Pulled Up | High Z | High Z | Output Low |
| 511 | High Z | Input Pulled Up | High Z | Output Low |
| 512 | High Z | High Z | Input Pulled Up | Output Low |

If multiple actuators of the actuators 501-512 are pressed at one time, a ghosting condition may occur at the terminals 542-548. Without being configured to detect the ghosting condition, a control circuit may erroneously determine that a particular actuator has been actuated when in fact multiple actuators have been actuated. For example, if actuators 502 and 508 are pressed (e.g., the user accidently hits two buttons at once), the control circuit 540 may erroneously determine that actuator 501 has been pressed and the control circuit 540 may perform the associated function corresponding to the actuation of actuator 501. In this example, the control circuit 540 may configure terminal 544 to be an input pulled-up high towards the supply voltage, configure the drive terminal 542 to be an output driven low towards circuit common, and configure terminals 546 and 548 to the high-impedance state. The control circuit 540 may measure the magnitude of the voltage at terminal 544, determine that the magnitude of the voltage at terminal 544 is not high (e.g., not at approximately the supply voltage), and thus come to a conclusion that actuator 501 is presently being actuated. If the control circuit 540 were to perform the function associated with actuator 501, the user may be confused since actuators 502 and 508 were pressed.

In addition, ghosting conditions may occur if three or more buttons are pressed at once. For example, if actuators 502, 509, and 511 are pressed (e.g., the user accidently hits three buttons at once), the control circuit 540 may erroneously determine that actuator 501 has been pressed and the control circuit 540 may perform the associated function corresponding to the actuation of actuator 501.

The control circuit 540 may be configured to be able to detect ghosting conditions. For example, the control circuit 540 may be configured to read (e.g., measure) the magnitude of the voltage at one of the terminals 542-548 to detect if ghosting is occurring. In addition, the control circuit 540 may be configured to identify how many of the actuators and/or which actuators are presently being actuated. The control circuit 540 may be configured to use the ADC to measure the magnitude of the voltage at each of the terminals 542-548 and to convert the analog value (e.g., the measured voltage) into a digital value representative of the magnitude of the voltage at the terminal.

The control circuit 540 may compare the magnitude of the measured voltage at each terminal 542-548 to a plurality of thresholds (e.g., reference voltages). In the example where the control circuit 540 configures terminal 544 to be an input pulled up towards the supply voltage, configure the drive terminal 542 to be an output driven low towards circuit common, and configures terminals 546 and 548 to the high impedance state, the control circuit 540 may measure the magnitude of the voltage at terminal 544. The control circuit 540 may compare the magnitude of the measured voltage to one or more thresholds (e.g., reference voltages), for example, to determine which and how many of the actuators 501-512 have been actuated. The control circuit 540 may also determine that the user has actuated multiple actuators 501-512 on purpose (e.g., to enter an advanced programing mode) or by mistake. If the control circuit 540 determines that the user has actuated multiple actuators 501-512 by mistake, the control circuit 540 may notify the user (e.g., by illuminating or flashing an LED on the actuator input circuit 500).

The thresholds may be determined (e.g., predetermined) based on a rated voltage (e.g., a rated forward voltage) associated with the current regulating devices of the actuator input circuit 500 (e.g., the diodes 521-532). Each of the one or more thresholds may be associated with a rated forward voltage (e.g., a voltage drop) of one or more diodes (e.g., one diode drop, two diode drops, and/or three diode drops). For example, the control circuit 540 may utilize three thresholds $V_{TH1}$, $V_{TH2}$, $V_{TH3}$, that may have values dependent upon the voltage drops associated with the voltage drops of one, two, and three diodes, respectively. A measured voltage less than the first threshold $V_{TH1}$ may indicate a voltage drop of a single diode. A measured voltage greater than the first threshold $V_{TH1}$ and less than the second threshold $V_{TH2}$ may indicate a voltage drop of two diodes. A measured voltage greater than the second threshold $V_{TH2}$ and less than the third threshold $V_{TH3}$ may indicate a voltage drop of three diodes. If the voltage drop associated with each diode 521-532 is approximately 0.7 volts, then the first threshold $V_{TH1}$ may be 1 volt, the second threshold $V_{TH2}$ may be 1.7 volts, and the third threshold $V_{TH3}$ may be 2.4 volts.

The control circuit 540 may be configured to distinguish a single actuated actuator from multiple actuated actuators, for example, by comparing the measured voltage at one of the terminals to the one or more thresholds $V_{TH1}$, $V_{TH2}$, $V_{TH3}$. For example, when actuator 501 is actuated, the magnitude of the voltage measured by control circuit 540 at terminal 544 may be approximately 0.7 volts (e.g., a single diode drop). The control circuit 540 may compare the measured voltage of 0.7 volts at the terminal 544 to the first threshold $V_{TH1}$. Since the measured voltage is less than the first threshold $V_{TH1}$, the control circuit 540 may determine that only one actuator (e.g., actuator 501) is actuated.

If actuators 502 and 508 are pressed (e.g., the user accidently pressed two buttons at once or pressed two buttons on purpose), the magnitude of the voltage measured by the control circuit 540 at terminal 544 may be approximately 1.4 volts (e.g., two diode drops) when the control circuit is trying to determine if actuator 501 is being pressed. The control circuit 540 may compare the measured voltage of 1.4 volts to the first threshold $V_{TH1}$, the second threshold $V_{TH2}$, and/or the third threshold $V_{TH3}$. Since the measured voltage is greater than the first threshold $V_{TH1}$, the control circuit 540 may determine that a ghosting condition is occurring. In addition, since the measured voltage is less than the second threshold $V_{TH2}$, the control circuit 540 may determine that two actuators are presently being actuated. Based on the configuration of the terminals (e.g., terminal 542 low and terminal 544 pulled high) and the magnitude of the measured voltage (e.g., 1.4 volts indicating two buttons pressed), the control circuit 540 may determine that two actuators are being actuated (e.g., actuators 502 and 508). Upon determining the actuation of the two actuators 502 and 508, the control circuit 540 may check to see if the actuation of actuators 502 and 508 activates an advanced programming mode, or alternative, if it was the result of user error. In another example, the control circuit may mark a state of each actuator as open, actuated, or quarantined as the control circuit compares the measured signal with the multiple thresholds and records the states of actuators 501-512 before determining whether the actuation of actuators 502 and 508 activates an advanced programming mode or is the product of user error.

If actuators 502, 509, and 511 are pressed (e.g., the user accidently pressed three buttons at once or pressed three buttons on purpose), the magnitude of the voltage measured by the control circuit 540 at terminal 544 may be approximately 2.1 volts (e.g., three diode drops) when the control circuit is trying to determine if actuator 501 is being pressed. The control circuit 540 may compare the measured voltage of 2.1 volts to the first threshold $V_{TH1}$, the second threshold $V_{TH2}$, and/or the third threshold $V_{TH3}$. Since the measured voltage is greater than the first threshold $V_{TH1}$, the control circuit 540 may determine that a ghosting condition is occurring. In addition, since the measured voltage is greater than the second threshold $V_{TH2}$ and less than the third threshold $V_{TH3}$, the control circuit 540 may determine that three actuators are presently being actuated. Based on the configuration of the terminals (e.g., terminal 542 low and terminal 544 pulled high) and the magnitude of the measured voltage (e.g., 2.1 volts indicating three buttons pressed), the control circuit 540 may determine that three actuators are being actuated (e.g., actuators 502, 509, and 511). Upon determining the actuation of the three actuators 502, 509, and 511, the control circuit 540 may check to see if the actuation of actuators 502, 509, and 511 activates an advanced programming mode. Alternatively, the control circuit 540 may conclude that the actuation was the product of user error. In another example, the control circuit may mark a state of each actuator as open, actuated, or quarantined as the control circuit compares the measured signal with each of the multiple thresholds and records the states of actuators 501-512 before determining whether the actuation of actuators 502, 509, and 511 activates an advanced programming mode or is the product of user error.

Alternatively, the control circuit 540 may configure the terminals 542-546 differently prior to reading one of the terminals to determine if a particular actuator of the actuators 501-512 is presently being actuated. For example, the control circuit 540 may configure a first terminal that is connected to the anode of the diode in series with the particular actuator as an output, and may short the terminal to the supply voltage. The control circuit 540 may configure a second terminal that is connected to the cathode of the diode in series with the particular actuator as an input that is pulled down towards circuit common through an internal pull-down resistor, and may configure the second terminal as an ADC input. In addition, the control circuit 540 may configure each of the remaining terminals to the high-impedance state. In this example, the control circuit 540 may use three different thresholds $V_{TH4}$, $V_{TH5}$, $V_{TH6}$ when determining if a ghosting condition is occurring. A measured voltage greater than the fourth threshold $V_{TH4}$ may indicate a voltage drop of a single diode. A measured voltage less than the fourth threshold $V_{TH4}$ and greater than the fifth threshold $V_{TH5}$ may indicate a voltage drop of two diodes. A measured voltage less than the fifth threshold $V_{TH5}$ and greater than sixth threshold $V_{TH6}$ may indicate a voltage drop of three diodes. If the supply voltage has a magnitude of 5 volts and the voltage drop associated with each diode 521-532 is approximately 0.7 volts, then the fourth threshold $V_{TH4}$ may be 4 volts, the fifth threshold $V_{TH5}$ may be 3.3 volts, and the sixth threshold $V_{TH6}$ may be 2.6 volts.

Figure 6:
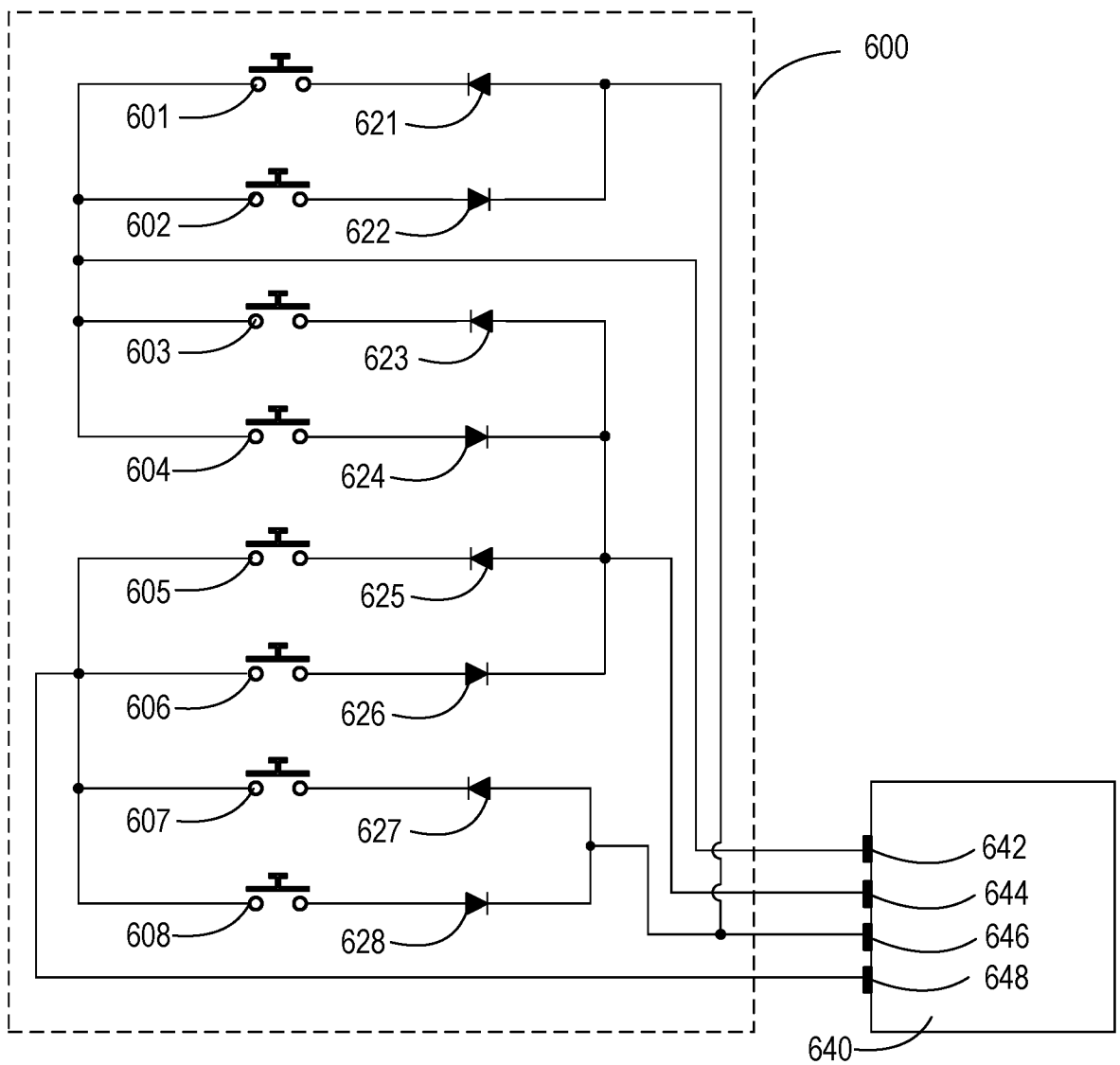
FIG. 6 is a diagram of another example of an actuator input circuit and a control circuit that is configured to perform a charlieplexing technique and detect a ghosting condition.

FIG. 6 is a diagram of another example actuator input circuit 600 and example control circuit 640 that may be configured to perform a charlieplexing technique and detect ghosting conditions. The control circuit 640 may be an example of the control circuit 414 of the control device 400, and the actuator input circuit 600 may be an example of the actuator input circuit 416 of the control device 400. The control circuit 640 (e.g., a processor, such as a microprocessor) may include a plurality of terminals, such as the four terminals 642, 644, 646, and 648, while the analog input circuit 600 may include a plurality of actuators 601-608 and a plurality of current regulating devices, such as diodes 621-628. The control circuit 640 may be configured to perform the charlieplexing technique with terminals 642-648 and detect a ghosting condition, for example, as described with reference to the control circuit 540. The difference between the actuator input circuit 600 and the actuator input circuit 500 is that the actuator input circuit 600 includes less than the maximum number $N_{MAX}$ of possible actuators (e.g., eight actuators 601-608 and associated diodes 621-628) as opposed to the twelve actuators 501-512 and associated diodes 521-532 shown in FIG. 5. The eight actuators 601-608 of the actuator input circuit 600 shown in FIG. 6 may be arranged such that a ghosting condition cannot occur in response to the actuation of two of the actuators at the same time. Ghosting conditions may only occur in response to the actuation of three or more of the actuators 601-608 at the same time.

Figure 7:
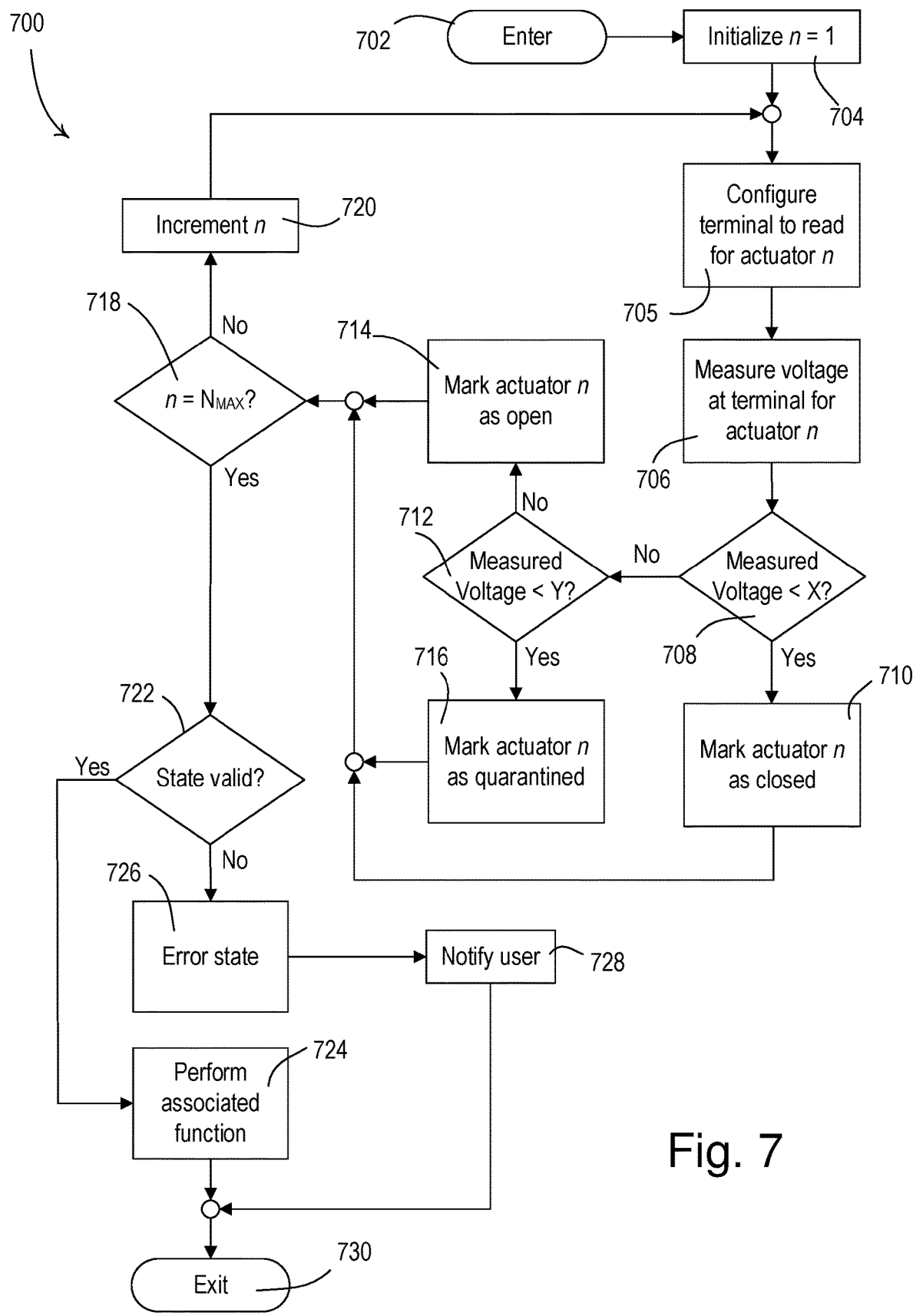
FIG. 7 is a flowchart illustrating an example of a control procedure performed by a control circuit of a load control device.

FIG. 7 is a flowchart illustrating an example control procedure 700 that may be executed by a control circuit of a control device (e.g., the control circuit 414 of the control device 400, the control circuit 540, and/or the control circuit 640). The control circuit may execute the control procedure 700 periodically (e.g., autonomously) and/or in response to receiving an indication (e.g., via one or more actuators and/or a communication circuit). During the control procedure 700, the control circuit may use a variable n to keep track of a number of actuators that are read. Based on a dataset that is created by the control circuit using the control procedure 700, the control circuit may determine whether a ghosting condition has occurred, which may indicate an error.

At 702, the control circuit may start the control procedure (e.g., autonomously or based on a receipt of an indication). At 704, the control circuit may initialize the variable n to one (e.g., n=1). The variable n may have a maximum value $N_{MAX}$ that is equal to the number of actuators of the load control device, such that each value of n is associated with a different actuator of the load control device. At 705, the control circuit may configure the terminals appropriately for the present actuator to be read (e.g., driven low, pulled-up high, high-impedance, etc.) as described above. At 706, the control circuit may measure the magnitude of a voltage at a terminal, where an actuator may be coupled between the terminal and another terminal. For example, the control circuit may compare the measured voltage with one or more thresholds X, Y (e.g., the thresholds $V_{TH1}$, $V_{TH2}$, respectively). The thresholds X, Y may have values based on a different number of diode drops. For example, measured voltages less than the threshold X may indicate a voltage drop of one diode and measured voltages greater than the threshold X and less than the threshold Y may indicate a voltage drop of more than one diodes (e.g., two diodes). As such, threshold Y may be a greater numerical value than threshold X.

At 708, the control circuit may compare the measured voltage to the threshold X. If the control circuit determines that the measured voltage is less than the threshold X, the control circuit may mark a state of the actuator n as "closed" at 710. For example, the control circuit may mark the actuator n as actuated in a volatile or non-volatile memory for comparison later to a predetermined dataset (e.g., table). If the control circuit determines that the measured voltage is not less than the threshold X, the control circuit may compare the measured voltage with the threshold Y at 712. If the control circuit determines that the measured voltage is less than the threshold Y at 712, the control circuit may determine that a ghosting condition has occurred and mark the state of the actuator n as "quarantined" at 716. If the control circuit determines that the measured voltage is not less than the threshold Y at 712, the control circuit may mark the state of the actuator n as "open" at 714.

At 718, the control circuit may determine whether n is equal to $N_{MAX}$. If the control circuit determines that n is not equal to $N_{MAX}$ (e.g., n is less than $N_{MAX}$), then the control circuit may increment n at 720 and perform 705-716 again with an incremented value of the variable n. For example, the control circuit may perform 705-716 again at a different terminal associated with a different actuator. If the control circuit determines that n is equal to $N_{MAX}$ at 718, then the control circuit may determine that all actuators have been read and characterized, and proceeds to 722.

At 722, the control circuit may compare the states of the marked actuators (e.g., "closed," "open," or "quarantined" for each of the actuators of the load control device) to the preconfigured dataset to determine whether the states of the marked actuators are valid. The states of the marked actuators may be valid if a valid current path can be formed based on the states of the marked actuators is valid.

The preconfigured dataset may include valid combinations of states for each actuator (e.g., combinations corresponding to valid actuations of one or more actuators by a user). For example, one combination in the dataset may include a state of "open" for each actuator, indicating the user did not actuate any of the actuators. For further example, a combination may include a state of "open" for all but one actuator and a state of "closed" for a single actuator, indicating that the user actuated a single actuator and a ghosting condition did not occur. Further, there may be some combinations that correspond to advanced programming modes. These combinations may include multiple actuators with a state of "closed", one or more actuators with a state of "open", and one or more actuators with a state of "quarantined."

If the control circuit determines that the states of the actuators are valid at 722, the control circuit may perform a function associated with the states of the actuators (e.g., associated function) at 724. The validation of the states of the actuators may include checking whether hardware supports the associated function and/or the associated function is enabled based on rules. The rules may entail whether a valid combination of the states of the actuators enables an advanced programming mode for the load control device. The associated function may include a function performed by the load control device corresponding to an actuation of a single actuator. The associated function may include an advanced programming mode corresponding to an actuation of multiple actuators. The advanced programming mode may, for example, be used by a technician or user to add, remove, or change features of the load control device. In another example, an advanced programming mode may automatically switch an operating mode of the load control device.

If the control circuit determines that the states of the actuators are not valid at 722, the control circuit may determine an error has occurred at 726. For example, the control circuit may determine that the combination of states of actuators is invalid if multiple actuators are indicated as actuated and/or one or more actuators are marked as quarantined, and the combination of the states of the actuators do not match one of the combinations in the dataset. If the control circuit determines an error has occurred at 726, then the control circuit, at 728, may notify a user of the load control device that the error has occurred. For example, the control circuit may illuminate and/or flash an LED of the load control device, play an audible noise via the load control device, transmit a digital message, etc. Further, if the control circuit determines an error has occurred at 726, the control circuit may not adjust any of the electrical loads of the system. The control circuit may exit the control procedure 700 at 730.

One will understand that the methods described herein are for example only, and the embodiments are not limited to the number of actuators shown, but also may be applied to a device having any number N terminals on a control circuit and up to N(N−1) actuators.

What is claimed is:

1. A load control device for controlling power delivered to an electrical load, the load control device comprising:
an actuator input circuit comprising a plurality of actuators and a plurality of current regulating devices; and
a control circuit comprising a plurality of terminals, wherein each of the plurality of actuators are electrically coupled between a current regulating device of the plurality of current regulating devices and a terminal of the plurality of terminals, the number of the actuators being greater than the number of the terminals; and
wherein the control circuit is configured to:
measure the magnitude of a signal at a first terminal of the plurality of terminals, wherein an actuator of the plurality of actuators is electrically coupled between the first terminal and a second terminal;
compare the magnitude of the measured signal to a first threshold that is dependent upon a magnitude of a voltage drop associated with the current regulating device; and
determine that the actuator electrically coupled between the first and second terminals has been actuated when the magnitude of the measured signal is less than the first threshold.

2. The load control device of claim 1, wherein the current regulating device comprises a diode.

3. The load control device of claim 1, wherein the first threshold is dependent upon the magnitude of the voltage drop associated with the current regulating device.

4. The load control device of claim 3, wherein the control circuit is further configured to:
compare the magnitude of the measured signal to a second threshold when the measured signal is equal to or greater than the first threshold;
mark the actuator as quarantined when the magnitude of the measured signal is less than the second threshold; and
mark the actuator as open when the magnitude of the measured signal is equal or greater than the second threshold.

5. The load control device of claim 4, wherein the control circuit is further configured to:
continue to determine whether remaining actuators of the actuator input circuit are actuated, marked as quarantined, or marked as open;
compare the actuators that are marked as quarantined with a dataset; and determine an error has occurred when the actuators that are marked as quarantined differ from a dataset.

6. The load control device of claim 1, wherein the control circuit comprises an analog-to-digital converter for measuring the magnitude of the signal at the first terminal.

7. The load control device of claim 1, wherein the control circuit is configured to determine that a ghosting condition occurred when the magnitude of the measured signal is equal to or greater than the first threshold.

8. The load control device of claim 7, wherein the ghosting condition is indicative of two or more actuators of the actuator input circuit being actuated simultaneously, the actuation of the two or more actuators creating a second path between the first and second terminal, the second path being an alternative to a first path created between the first and second terminals.

9. The load control device of claim 8, wherein the control circuit is further configured to notify a user of the ghosting condition.

10. The load control device of claim 1, wherein the number of the terminals is equal to N and the number of the actuators is less than or equal to N(N−1).

11. The load control device of claim 1, wherein the measured signal is an analog signal.

12. The load control device of claim 1, wherein an actuator of the actuator input circuit is actuated via a user input.

13. A method for controlling power delivered to an electrical load, the method comprising:
   measuring the magnitude of a signal at a first terminal of a plurality of terminals of a control circuit, the plurality of terminals electrically coupled to a plurality of actuators, wherein the number of the actuators is greater than the number of the terminals, and wherein each of the plurality of actuators is electrically coupled between a terminal of the plurality of terminals and a current regulating device;
   comparing the magnitude of the measured signal to a first threshold that is dependent upon a magnitude of a voltage drop associated with the current regulating device; and
   determining that the actuator electrically coupled between the first and a second terminal has been actuated when the magnitude of the measured signal is less than the first threshold.

14. The method of claim 13, wherein the threshold is dependent upon the magnitude of a voltage drop associated with the current regulating device.

15. The method of claim 13, further comprising:
   comparing the magnitude of the measured signal to a second threshold when the measured signal is equal to or greater than the first threshold;
   marking the actuator as quarantined when the magnitude of the measured signal is less than the second threshold; and
   marking the actuator as open when the magnitude of the measured signal is equal or greater than the second threshold.

16. The method of claim 13, further comprising:
   determining whether remaining actuators of the plurality of the actuators are actuated, marked as quarantined, or marked as open;
   comparing the actuators that are marked as quarantined with a dataset; and
   determining an error has occurred when the actuators that are marked as quarantined differ from the dataset.

17. A load control device for controlling power delivered to an electrical load, the load control device comprising:
   a plurality of actuators, each of the plurality of actuators connected with a current regulating device in series electrical connection; and
   a control circuit comprising a plurality of terminals electrically connected to the plurality of actuators, wherein the number of the actuators is greater than the number of the terminals, and wherein the control circuit is configured to:
   measure the magnitudes of the signals at the terminals of the control circuit; and
   compare the magnitudes of each of the measured signals to one or more thresholds that are dependent upon the magnitudes of one or more voltage drops associated with the current regulating devices; and
   detect which actuators of the plurality of actuators are currently being actuated based on the comparison.

18. The load control device of claim 17, wherein when multiple actuators of the plurality of actuators are currently being actuated, the control circuit is further configured to:
   determine a state configuration associated with the plurality of actuators, wherein the state configuration is based on the comparison of the magnitudes of each of the measured signals to the one or more thresholds; and
   compare the state configuration to a predetermined dataset comprising known state configurations;
   determine, based on the comparison, whether the state configuration is a valid state configuration; and
   based on the determination that the state configuration is a valid state configuration, perform a function associated with the state configuration.

19. The load control device of claim 18, further wherein the control circuit is configured to determine an error has occurred based on the determination that the state configuration is not a valid state configuration.

20. The load control device of claim 17, wherein the one or more thresholds comprise:
   a first threshold greater than the magnitude of a voltage drop of a single current regulating device and less than the magnitude of a voltage drop of two current regulating devices coupled in series; and
   a second threshold greater than the magnitude of a voltage drop of two current regulating devices coupled in series and less than the magnitude of a voltage drop of three current regulating devices coupled in series.

21. The load control device of claim 20, wherein the control circuit is configured to detect that two actuators of the plurality of actuators are being actuated when the magnitude of the measured signal is greater than the first threshold and less than the second threshold.

22. The load control device of claim 20, wherein the control circuit is configured to detect that three or more actuators of the plurality of actuators are being actuated when the magnitude of the measured signal is greater than the second threshold.

* * * * *